United States Patent [19]

Tower et al.

[11] Patent Number: 4,855,808
[45] Date of Patent: Aug. 8, 1989

[54] HERMETIC GLASS CHIP CARRIER

[76] Inventors: Steven A. Tower, 13 Onyx Dr., North Dartmouth, Mass. 02747; Jay S. Greenspan, 7 Hillside St., South Dartmouth, Mass. 02748

[21] Appl. No.: 30,553

[22] Filed: Mar. 25, 1987

[51] Int. Cl.$^4$ ............... H01L 23/08; H01L 23/50; H01L 23/30
[52] U.S. Cl. ........................ 357/74; 357/73; 174/52.4
[58] Field of Search ............... 357/73, 74; 174/52 FP

[56] References Cited

U.S. PATENT DOCUMENTS

| | | | |
|---|---|---|---|
| 3,381,080 | 4/1968 | Stelmak | 357/73 |
| 3,482,419 | 12/1969 | Rogers et al. | 357/73 |
| 4,190,735 | 2/1980 | Checki, Jr. | 174/52 FP |
| 4,742,182 | 5/1988 | Fuchs | 357/73 |

FOREIGN PATENT DOCUMENTS 2137809  10/1984  United Kingdom ............... 357/74

Primary Examiner—Andrew J. James
Assistant Examiner—John Lamont
Attorney, Agent, or Firm—Weingarten, Schurgin, Gagnebin & Hayes

[57] ABSTRACT

A hermetically sealed glass chip carrier includes an outer glass ring and an inner glass base in which leads to the inner glass base pass between the ring and the base, with the ring, base and leads being sealed together by melting the glass in the vicinity of the seal. In one embodiment, the base includes a stepped annular lip with the leads protruding between the space between the base and the lip and onto the top surface of the lip. In an alternative embodiment, a Kovar substrate pad may be secured to the base. Complete hermetic sealing is accomplished through the use of a lid which contacts the top surface of the ring and is hermetically sealed thereto. The external leads may be formed and trimmed in various configurations to provide an elevated pad, a plug-in, or a socket-type configuration.

19 Claims, 2 Drawing Sheets

HERMETIC GLASS CHIP CARRIER

FIELD OF INVENTION

This invention relates to chip carriers and, more particularly, to an all glass hermetically sealed chip carrier.

BACKGROUND OF THE INVENTION

Standard chip carriers are currently made out of ceramic materials with ventilation for leads and conductors. The problem with the utilization of ceramic material is that the final package hermeticity is relatively low. This is because ceramic is a rather porous material. Currently ceramic chip carriers will only pass hermeticity of $1 \times 10^{-6}$ atms. cc/sec He and require special chips for the mounting of printed circuit boards due to the differences in coefficient of thermal expansion between the ceramic and the printed circuit boards. Moreover, the dielectric constant of ceramic materials is relatively high, which limits the speed at which the circuits contained within the package may operate.

Examples of prior chip carriers and sealing systems are exemplified by U.S. Pat. Nos. 3,370,874; 3,600,017; 3,924,246; 4,008,945; 4,262,300; 4,266,084; 4,266,090; 4,423,093; 4,451,540; 4,453,033; 4,547,624; 4,487,999; U.S. Pat. No. Des. 210,829; and 3,825,876.

SUMMARY OF THE INVENTION

In order to achieve an improved hermeticity of $1 \times 10^{-8}$ atm, cc/sec He, while at the same time both permitting direct mounting to printed circuit boards without mounting clips and increasing the speed at which circuits within a carrier may be operated, a glass hermetically sealed package is provided having a glass ring which is hermetically sealed to a glass base by melting of the glass at the interface between the ring and the base, and an integrated circuit chip is bonded to the top surface of the base. The leads to the interior of the package are provided between the periphery of the base which contacts the interior surface of the ring, such that upon sealing of the base to the ring the leads are hermetically sealed due to the melting of the glass at the periphery of the base and the glass at the interior surface of the ring. In one embodiment the base is provided with a stepped annular lip, usually rectilinear in configuration, which provides a top surface onto which the leads may be bonded, thus providing contact pads at an appropriate level to minimize the wire bonding lead length between the chip contact pads and the elevated pads. It should be noted that the chip is usually bonded to the top surface of the base. The lip in essence forms an inner ring step for this purpose so that wire bonds, usually one mil in diameter gold wire, can be kept as short as possible. In manufacture, the glass bottom piece and the glass ring are fabricated separately and the leads are then laid in between the two in an appropriate manner. The glass around the juncture between the base and the ring is then melted to provide a hermetic seal between the base and the ring which also seals the leads at the base-ring interface.

In an alternative embodiment, a Kovar substrate pad may be bonded interior to the ring of the base. Note that Kovar is a nickel-iron-cobalt alloy. The integrated circuit chip is then mounted to the base and wire bonded to the appropriate pads. Thereafter a lid is hermetically sealed to the top surface of the ring, with the lid material being preferably Kovar, although a metal lid, a glass lid or a ceramic lid may be utilized.

The leads that extend from the package may be configured in an appropriate configuration such as to provide in one embodiment an elevated pad, in another embodiment plug-in downwardly depending pins, or may be formed into a socket arrangement in which the exposed base from the package is bent upwardly along the outside surface of the ring where it is bonded thereto.

While the package has been described as having an inner glass base, the base may extend across the bottom of the ring, with the leads passing to the package interior at the ring bottom base interface.

The resultant package has the advantages of increased hermeticity due to the glass construction and, with the lower dielectric constant, permits integrated circuits to be mounted therein which can operate at speeds commensurate with the low dielectric constant of glass.

DESCRIPTION OF THE DRAWINGS

These and other features of the subject invention will be better understood in connection with the detailed description taken in conjunction with the drawing of which.

DETAILED DESCRIPTION OF THE INVENTION

Figure 1:
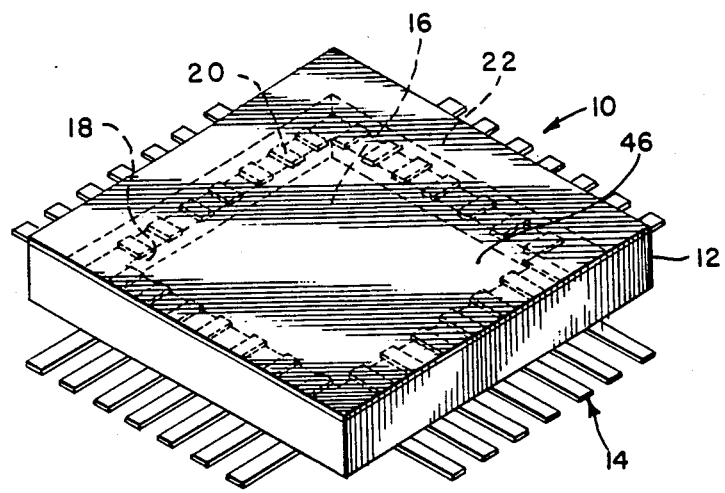
FIG. 1 is a diagrammatic illustration of one embodiment of the glass chip carrier with lid in place.

Referring now to FIG. 1, a hermetically sealed glass chip carrier 10 is seen to include a ring 12, which is generally rectangular in configuration, and leads 14 extending from the base thereof. The base of the package is generally indicated by dotted arrow 16 to include a stepped annular lip portion shown in dotted outline by 18 on which are secured contact pads 20 which are bonded to the top surface 22 of the stepped annular lip portion.

Figure 2:
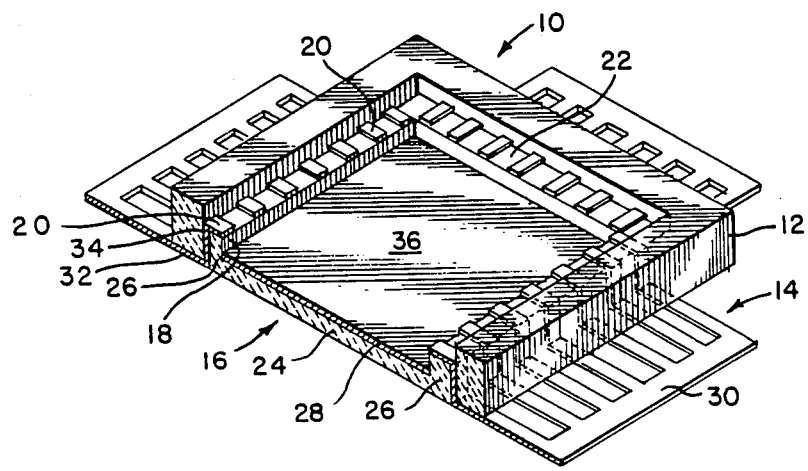
FIG. 2 is a diagrammatic and partial sectional view of the package of FIG. 1 illustrating the exterior ring and an interior base having a stepped lip onto which contact pads are mounted, also showing an optional Kovar substrate pad bonded to the base.

Referring to FIG. 2, the construction of the package can be seen in which ring 12 is seen to be fabricated of glass, as is base 16 which includes a horizontal bottom portion 24 and side portions 26 which in a preferred embodiment are raised above the top surface 28 of the base so as to form the aforementioned stepped annular lip 18. Contact pads 20 correspond to respective leads 14 which, in this view are shown prior to removal of the corresponding lead support 30 which is used in the manufacturing process.

As can be seen, each lead 14 runs from a position exterior of ring 12 along the bottom surface 32 of ring 12 up the side 34 of ring 12 and over top surface 22 of the stepped lip where they are secured.

In an alternative embodiment, a Kovar substrate 36 is placed interiorally of annular lip portion 18 and it is to this base that an integrated circuit package (not shown) may be mounted. Alternatively, the integrated circuit package may be mounted directly to the top surface 28 of base 16.

Figure 3:
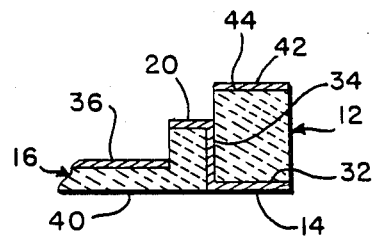
FIG. 3 is a cross-sectional view of a portion of the package of FIGS. 1 and 2 illustrating the passage of a lead from the bottom of the ring up through the interface between the ring and the stepped base and over the top surface of the stepped portion of the base.

Referring to FIG. 3, an exploded view of a portion of the chip carrier is illustrated in which like reference characters are utilized to represent like elements. Here it can be seen that ring 12 has a bottom portion 32 adjacent a portion of lead 14. In the illustrated embodiment, this portion of the lead is flush with bottom surface 40 of base 16. The lead passes between the interface between base 16 and ring 12 as illustrated at 34, from which it is bent horizontally at 20 to form the aforementioned contact pad. In this diagram the optional Kovar, or other substrate 36, is in evidence.

In manufacture, the sandwich structure of FIG. 3 is formed by placing the base within the ring with the appropriate leads therebetween, and the glass is melted to its softening temperature to provide the hermetic seal.

A layer 42 of suitable material may be placed at the top surface 44 of ring 12 to facilitate the securing of a cover to the package once an integrated circuit has been mounted within the package and wire bonded to the appropriate leads. Referring back to FIG. 1, this cover is illustrated by reference character 46.

Figure 4:
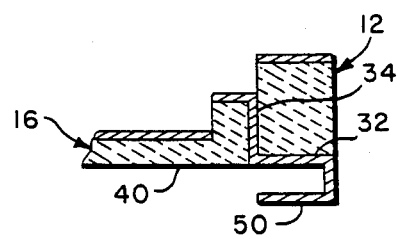
FIG. 4 is a cross-sectional view of one embodiment of the subject invention illustrating an elevated contact pad.

Referring to FIG. 4, lead 14 may be bent upon itself such that it is first bent downwardly and then inwardly such that a portion 50 is spaced from bottom surface 40 of the base, thereby to provide an elevated pad configuration.

Figure 5:
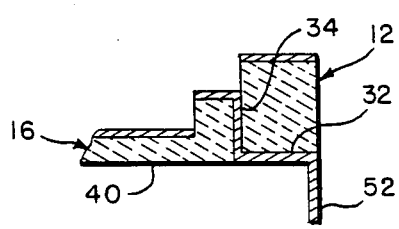
FIG. 5 is a cross-sectional view of another embodiment of the subject invention illustrating a plug-in pin configuration.

Alternatively, as illustrated in FIG. 5, lead 14 may be bent downwardly to form a pin 52 so that the chip carrier can be mounted to a circuit board or like device having through-holes to accommodate the respective pins.

Figure 6:
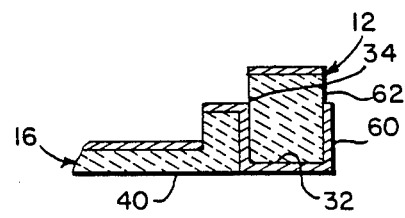
FIG. 6 is a cross-sectional view of a still further embodiment of the subject invention illustrating a socket-type configuration in which the portion of the lead extending from the package is trimmed and bent upwardly where it is bonded to the exterior face of the ring, thereby to form a contact to be received by a corresponding socket contact.

Referring to FIG. 6 in a still further embodiment, a socket-type configuration can be formed in which lead 14 is trimmed and bent upwardly as illustrated at 60 so that it runs up the side 62 of ring 12 where it is secured to this side in any conventional manner. This forms an exterior contact such that when the carrier is inserted into a suitable socket (not shown), this exterior contact mates with the corresponding interior contact of the socket.

It will be appreciated that the attachment of the lid to the finally configured device is conventional in nature and is not described herein; likewise the melting of the glass at the interface to achieve the hermetic seal is also conventional. In this respect, the glass is heated to a softening temperature which is below a temperature which would affect any of the circuits contained within the package and which is not so high as to destroy the structural configuration of the package.

Having indicated preferred embodiments of the present invention, it will occur to those skilled in the art that modifications thereof and alternatives can be practiced within the spirit of the invention. It is accordingly intended to define the scope of the invention only as indicated in the following claims:

What is claimed is:

1. A hermetically sealed glass chip carrier, comprising:
    a glass base member having bounding sidewalls;
    a glass sidewall member having interior sidewalls, a segment of each said interior sidewall being disposed adjacent corresponding said bounding sidewalls; and
    a plurality of conductive leads, each conductive lead further comprising
    a contact pad disposed on said glass base member,
    a body segment integral with said contact pad disposed intermediate said segment of said interior sidewall and said bounding sidewalls, and
    an extensible segment integral with said body segment extending exteriorly of said hermetically sealed glass chip carrier;
    wherein said bounding sidewalls, said segment of said interior sidewalls and each said body segment of said plurality of conductive leads are hermetically sealed together by subjecting said carrier to a softening temperature to cause bonding at interfaces thereof.

2. The hermetically sealed glass chip carrier according to claim 1 further comprising:
    an integrated circuit package disposed adjacent said glass base member and electrically connected to said contact pads; and
    a lid hermetically sealed to said glass sidewall member.

3. The hermetically sealed glass chip carrier according to claim 2 further including a substrate intermediate said integrated circuit package and said glass base member.

4. The hermetically sealed glass chip carrier according to claim 2 further including a sealing material intermediate said lid and said sidewall member.

5. The hermetically sealed glass chip carrier according to claim 1 wherein said glass base member further comprises a planar bottom portion and a stepped lip portion exeending upwardly from said planar bottom portion, said stepped lip portion having a top surface and external sidewalls, and wherein each said contact pad is mounted on said top surface and said external sidewalls are said bounding sidewalls.

6. The hermetically sealed glass chiP carrier according to claim 1 wherein said glass sidewall member further includes a bottom surface, and wherein a part of each said body segment of said plurality of conductive leads is conformable disposed adjacent said bottom surface.

7. The hermetically sealed glass chip carrier according to claim 6 wherein said glass sidewall member further includes external sidewalls, and wherein at least one said extensible segment of said plurality of leads extends exteriorly of said external sidewalls substantially normally thereto.

8. The hermetically sealed glass chip carrier according to claim 6 wherein said glass sidewall member further includes an external sidewalls, and wherein at least one said extensible segment of said plurality of leads extends normally of said bottom surface in the plane of said external sidewalls for a predetermined distance and then extends substantially parallel to said bottom surface and said part of said corresponding body segment, thereby forming at least one conductive lead of elevated pad configuration.

9. The hermetically sealed glass chip carrier according to claim 5 wherein said glass sidewall member further includes external sidewalls, and wherein at least one said extensible segment of said plurality of leads extends normally of said bottom surface in the plane of said external sidewalls.

10. The hermetically sealed glass chip carrier according to claim 5 wherein said glass sidewall member further includes external sidewalls, and wherein at least one said extensible segment of said plurality of leads extends normally of said part of said corresponding body segment adjacent said external sidewalls.

11. A hermetically sealed glass chip carrier, comprising:
a glass base member, said glass base member further comprising
a planar bottom having a floor surface and an exterior surface, and
base sidewall integral with and extending substantially normally of said planar bottom, said sidewall having a top surface, internal surfaces bounding said floor surface of said planar bottom, and peripheral bounding surfaces defining a periphery of said glass base member;
a glass sidewall member, said glass sidewall member further comprising
a top surface,
a bottom surface,
interior walls adjacent said internal surfaces of said base sidewall, said interior walls having a height greater than said base sidewall such that said floor surface, said internal surfaces of said base sidewall, said top surface of said base sidewall, upper segments of said interior walls above said top surface of said base sidewall and said top surface of said glass sidewall member form a stepped configuration, and
exterior walls forming a periphery of said hermetically sealed glass chip carrier; and
a plurality of conductive leads, each said plurality of conductive leads further comprising
a contact pad mounted on said top surface of said base sidewall,
a body segment integral with said contact pad disposed intermediate said peripheral bounding surfaces of said glass base member and said interior walls of said glass sidewall member, and
an extensible segment integral with said body segment extending exteriorly of said hermetically sealed glass chip carrier;
wherein said peripheral bounding surfaces of said glass base member, each said body segment of said plurality of conductive leads and said interior walls of said glass sidewall member in interfaced relation with said peripheral bounding surfaces are hermetically sealed together by subjecting said carrier to a softening temperature to cause bonding at interfaces thereof.

12. The hermetically sealed glass chip carrier according to claim 11 further comprising:
an integrated circuit package disposed adjacent said floor surface and electrically connected to said contact pads, and
a lid hermetically sealed to said top surface of said glass sidewall member.

13. The hermetically sealed glass chip carrier according to claim 12 further including a substrate intermediate said floor surface and said integrated circuit package.

14. The hermetically sealed glass chip carrier according to claim 12 further including a sealing material intermediate said top surface of said glass sidewall member and said lid.

15. The hermetically sealed glass chip carrier according to claim 11 wherein a part of each said body segment of said plurality of conductive leads is conformably disposed adjacent said bottom surface of said glass sidewall member.

16. The hermetically sealed glass chip carrier according to claim 15 wherein at least one said extensible segment of said plurality of conductive leads extends exteriorly of said exterior walls substantially normally thereto.

17. The hermetically sealed glass chip carrier according to claim 15 wherein at least one said extensible segment of said plurality of conductive leads extends normally of said bottom surface in a peripheral plane of said exterior walls and then extends substantially parallel to said bottom surface in a direction substantially parallel to said bottom surface and said part of said corresponding body segment, thereby forming at least on conductive lead of elevated pad configuration.

18. The hermetically sealed glass chip carrier according to claim 15 wherein at least one said extensible segment of said plurality of conductive leads extends normally of said bottom surface in a peripheral plane of said exterior walls.

19. The hermetically sealed glass chip carrier according to claim 15 wherein at least one said extensible segment of said plurality of conductive leads extends normally of said portion of said corresponding body segment adjacent a corresponding one of said exterior walls.

* * * * *

UNITED STATES PATENT AND TRADEMARK OFFICE
CERTIFICATE OF CORRECTION

PATENT NO. : 4,855,808

DATED : August 8, 1989

INVENTOR(S) : Steven A. Tower; Jay S. Greenspan

It is certified that error appears in the above-identified patent and that said Letters Patent is hereby corrected as shown below:

Cover Page: After item [22] Filed: Sep. 15, 1987, insert -- (Under 37 CFR 1.47) --

Column 1, line 16, "atms." should read --atm.--

Column 3, line 11, "interiorally" should read --interiorly--

Column 4, line 44, "exeending" should read --extending--

Column 4, line 49, "chiP" should read --chip--

Column 4, line 63, "includes an external sidewalls" should read --includes external sidewall--

Column 6, line 41, "on" should read --one--

Signed and Sealed this

Sixth Day of August, 1991

*Attest:*

HARRY F. MANBECK, JR.

*Attesting Officer*      *Commissioner of Patents and Trademarks*